United States Patent [19]

Kojima et al.

[11] Patent Number: 5,691,611
[45] Date of Patent: Nov. 25, 1997

[54] ABNORMALITY DETECTING SYSTEM AND ABNORMALITY DETECTING METHOD FOR ROTOR POSITION DETECTION MEANS, AND MOTOR CONTROL SYSTEM

[75] Inventors: Hiroyuki Kojima, Nishio; Akira Suzuki, Obu; Yutaka Hotta, Chiryu, all of Japan

[73] Assignee: Aisin AW Co., Ltd., Japan

[21] Appl. No.: 500,081

[22] Filed: Jul. 10, 1995

[30] Foreign Application Priority Data

Jul. 12, 1994 [JP] Japan .................. 6-159961

[51] Int. Cl.$^6$ ........................................ H02K 23/00
[52] U.S. Cl. .................. 318/254; 318/138; 318/439; 318/798-815
[58] Field of Search .................. 318/254, 138, 318/439, 599, 798–815; 388/804, 811, 907.2, 903; 363/41, 95, 165; 361/51, 23

[56] References Cited

U.S. PATENT DOCUMENTS

| | | | |
|---|---|---|---|
| 3,904,943 | 9/1975 | Klang | 388/804 X |
| 4,445,167 | 4/1984 | Okado | 363/41 X |
| 4,563,623 | 1/1986 | Matsuka | 388/804 X |
| 4,759,212 | 7/1988 | Sawada et al. | 73/118.1 |
| 4,876,527 | 10/1989 | Oka et al. | 180/197 X |
| 4,918,443 | 4/1990 | Yoshida et al. | 318/603 X |
| 4,939,435 | 7/1990 | Takahasi et al. | 318/432 |
| 4,963,800 | 10/1990 | Kajiwara et al. | 318/439 X |
| 5,045,763 | 9/1991 | Kobayashi et al. | 318/270 |
| 5,152,178 | 10/1992 | Kadota | 73/118 |
| 5,241,255 | 8/1993 | Oshima et al. | 318/801 |
| 5,306,998 | 4/1994 | Nakamura | 318/806 |
| 5,316,263 | 5/1994 | Mino | 318/601 X |
| 5,471,384 | 11/1995 | Nakashima et al. | 388/804 X |
| 5,481,168 | 1/1996 | Mutoh et al. | 318/811 X |
| 5,481,460 | 1/1996 | Masaki et al. | 318/811 X |
| 5,486,748 | 1/1996 | Konrad et al. | 318/811 |

FOREIGN PATENT DOCUMENTS 698585  4/1994  Japan .

*Primary Examiner*—Karen Masih
*Attorney, Agent, or Firm*—Lorusso & Loud

[57] ABSTRACT

An abnormality detecting system, for detecting an abnormality in a rotor position detector for detecting a magnetic pole position of a motor, includes a speed calculator for calculating the speed of the motor, and an abnormality detector for detecting an abnormality in the rotor position detector. A method for detecting an abnormality in rotor position includes calculating a instantaneous speed and average speed of the motor, judging whether or not the absolute value of a difference between the instantaneous speed and the average speed is greater than a set value, and, when it has been judged that the absolute value of the difference therebetween is greater than the set value, detecting an abnormality in the rotor position detecting means. A motor control system includes the rotor position detector, torque instruction value detector, a PWM signal control device, an inverter, the speed calculator, the abnormality detector, and a PW signal interrupter.

8 Claims, 10 Drawing Sheets

ABNORMALITY DETECTING SYSTEM AND ABNORMALITY DETECTING METHOD FOR ROTOR POSITION DETECTION MEANS, AND MOTOR CONTROL SYSTEM

BACKGROUND OF THE INVENTION

1. Field of the Invention

The present invention relates to an abnormality detecting system and method for detecting abnormalities in a rotor position detecting means, and to a motor control system.

2. Description of the Related Art

Conventionally, an electric vehicle equipped with a motor uses rotor position detecting means such as a resolver in order to detect the shaft angle. However, when wire harnesses (signal lines) of the rotor position detecting means are broken or short-circuited, or when an exciting circuit fails, it becomes difficult to control the motor with the result that a secondary failure occurs in the motor system.

Therefore, as a countermeasure to the foregoing, a single-purpose secondary rotary sensor such as an electromagnetic pickup type rotary sensor is provided and, by comparing a speed detected by such a secondary rotary sensor with a speed detected by the rotor position detecting means, breakage and short-circuiting of wire harnesses of the rotor position detecting means, failure of the exciting circuit, etc. are detected using the relative difference between the two speeds, thereby making the motor failsafe.

Alternatively, a comparator circuit and a pulse observation circuit are provided and a voltage waveform received from the rotor position detecting means is monitored by the comparator circuit and the pulse observation circuit to thereby detect breakage and short-circuiting of wire harnesses of the rotor position detecting means, failure of the exciting circuit, etc., thereby making the motor failsafe (see Japanese Unexamined Patent Application No. H-698585).

However, in the above-mentioned conventional motor control systems, since it is necessary to add a secondary rotary sensor, a comparator circuit, a pulse observation circuit, etc., the motor control system becomes large in size, complicated in structure, and high in cost. In addition, there is the possibility that breakage, short-circuiting, etc. of relevant wire harnesses may occur in the secondary rotary sensor per se, comparator circuit per se, pulse observation circuit per se, etc., which results in a higher likelihood of a system failure due to a fault somewhere in the motor control system.

SUMMARY OF THE INVENTION

The present invention has been devised in order to solve the above-mentioned problems inherent in the conventional motor control system, and an object of the present invention is to provide an abnormality detecting system and an abnormality detecting method for rotor position detecting means and a motor control system. Another object is to provide such an abnormality detection system which does not increase the size, complicate the structure, or increase the cost of the overall motor control system. Yet another object is to reduce the likelihood of a system failure.

Thus, the present invention provides an abnormality detecting system and method for rotor position detecting means able to detect breakage and short-circuiting of wire harnesses of the rotor position detecting means, failure of the exciting circuit, etc. To this end, the abnormality detecting system of the present invention includes rotor position detecting means for detecting a magnetic pole position of a motor, speed calculating means for calculating the speed of the motor on the basis of an output value generated from the rotor position detecting means, and abnormality detecting means for detecting an abnormality in the rotor position detecting means on the basis of the speed calculated by the speed calculating means.

In a preferred embodiment the speed calculating means calculates an instantaneous speed and average speed of the motor, and the abnormality detecting means judges whether or not the absolute value of the difference between the instantaneous speed and average speed of the motor is greater than a set value and a difference in the absolute value greater than the set value is taken as an abnormality of the rotor position detecting means.

In another preferred embodiment of the present invention, the speed calculating means calculates an average speed of the motor, the abnormality detecting means judges whether or not the average speed is greater than a set value and a judgement that the average speed is greater than the second set value is treated as detection of an abnormality of the rotor position detecting means.

The abnormality detecting method of the present invention, in one embodiment, includes calculating an instantaneous speed and an average speed of the motor on the basis of an output value from rotor position detecting means for detecting a magnetic pole position of the motor, comparing the absolute value of the difference between the instantaneous speed and the average speed with a set value, and, when it has been judged that the absolute value of the difference therebetween is greater than the set value, signaling an abnormality in the rotor position detecting means.

In another embodiment the abnormality detecting method of the present invention includes calculating an average speed of a motor on the basis of an output value from the rotor position detecting means for detecting a magnetic pole position of the motor, comparing the calculated average speed with a set value, and, when the average speed is greater than the set value, signaling an abnormality of the rotor position detecting means.

The present invention also provides a motor control system which includes rotor position detecting means for detecting magnetic pole position of a motor, torque instruction value detecting means for detecting a torque instruction value given to the motor, a PWM signal control device for outputting a PWM signal on the basis of signals from the rotor position detecting means and the torque instruction value detecting means, and an inverter for converting direct current from a battery into alternating current and for outputting to the motor an alternating current corresponding to the PWM signal from the PWM signal control device. This motor control system further includes speed calculating means for calculating the speed of the motor on the basis of an output signal from the rotor position detecting means, abnormality detecting means for detecting an abnormality of the rotor position detecting means on the basis of the speed calculated by the speed calculating means, and interruption means for, when it has been detected by the abnormality detecting means that the rotor position detecting means is abnormal, interrupting the PWM signal from the PWM signal control device.

In one embodiment of the motor control system of the present invention, the speed calculating means calculates the instantaneous speed and the average speed of the motor, and the abnormality detecting means compares the absolute value of the difference between the instantaneous speed and the average speed of the motor with a set value and, when the absolute value of this difference is greater than the set value, signals an abnormality of the rotor position detecting means.

In another embodiment of the motor control system of the present invention, the speed calculating means calculates an average speed of the motor, and the abnormality detecting means compares the average speed with a set value and, when it has been judged that the average speed is greater than the set value, detects an abnormality of the rotor position detecting means.

The PWM signal control device may include a triangular wave generating circuit for generating a standard triangular wave signal, a current comparing circuit for comparing current instruction signals detected by the rotor position detecting means and the torque instruction value detecting means with feedback motor current signals and for outputting current deviation signals, a PWM signal generating circuit for outputting PWM signals in response to the current deviation signals from the current comparing circuit and the standard triangular wave signal from the triangular wave generating circuit, a gate circuit for amplifying the PWM signals from the PWM signal generating circuit and outputting the amplified signals to the inverter, and a gate closure circuit for, responsive to detection of an abnormality by the abnormality detecting means, interrupting the PWM signals from the PWM signal generating circuit.

When wire harnesses of the rotor position detecting means are broken or short-circuited, the speed characteristics of the motor change. Therefore, in the present invention it is not necessary to employ a secondary rotary sensor, a comparator circuit, a pulse observation circuit, etc. As a result, the system need not have a large size, or a complicated structure, and can be made low in cost. Further, the likelihood of a system shutdown due to a failsafe operation can be reduced.

DESCRIPTION OF THE ACCOMPANYING DRAWINGS

DESCRIPTION OF THE PREFERRED EMBODIMENT

A preferred embodiment of the present invention will now be described in detail with reference to the drawings.

Figure 1:
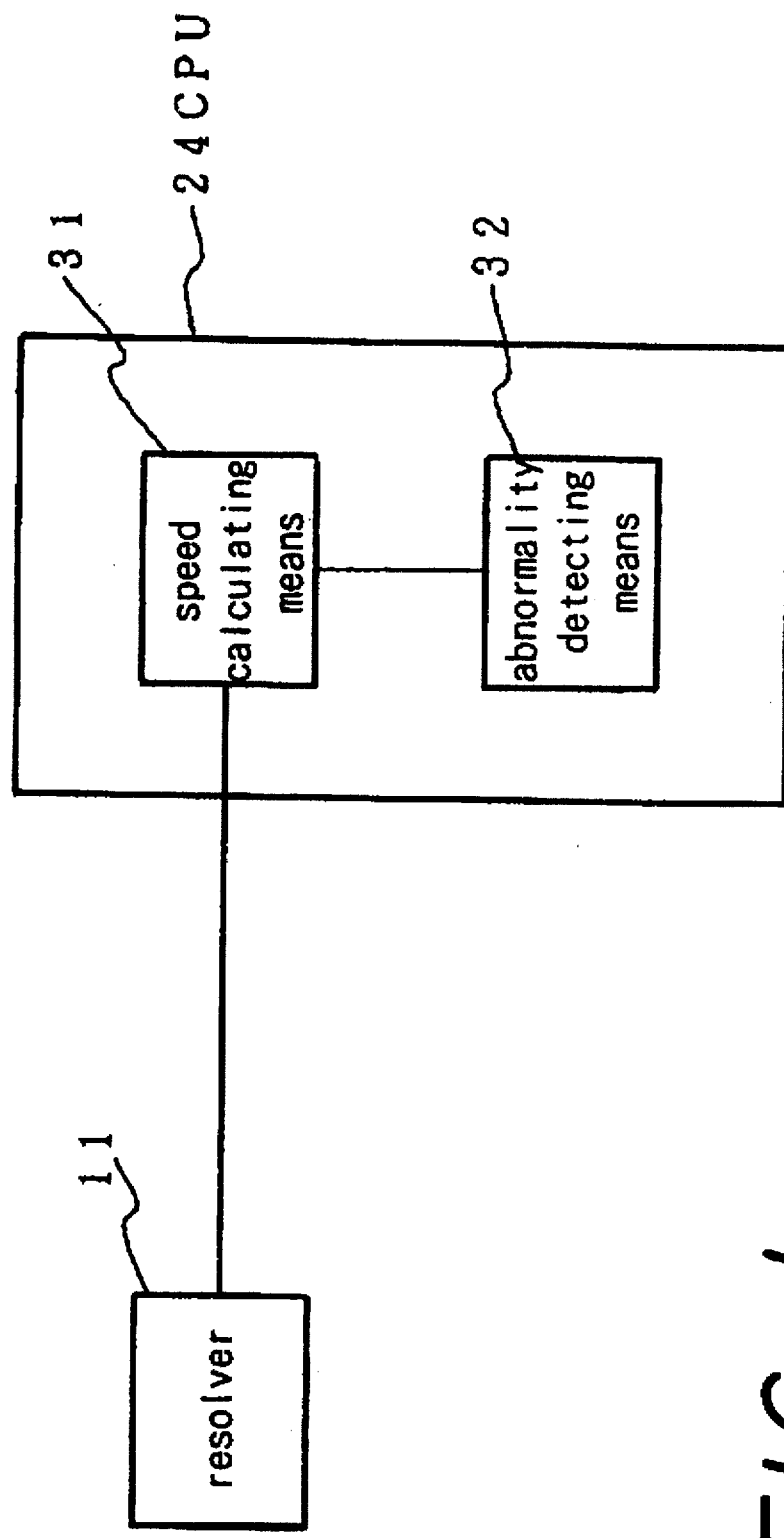
FIG. 1 is a block diagram illustrating an abnormality detecting system for rotor position detecting means in an embodiment of the present invention.
Figure 2:
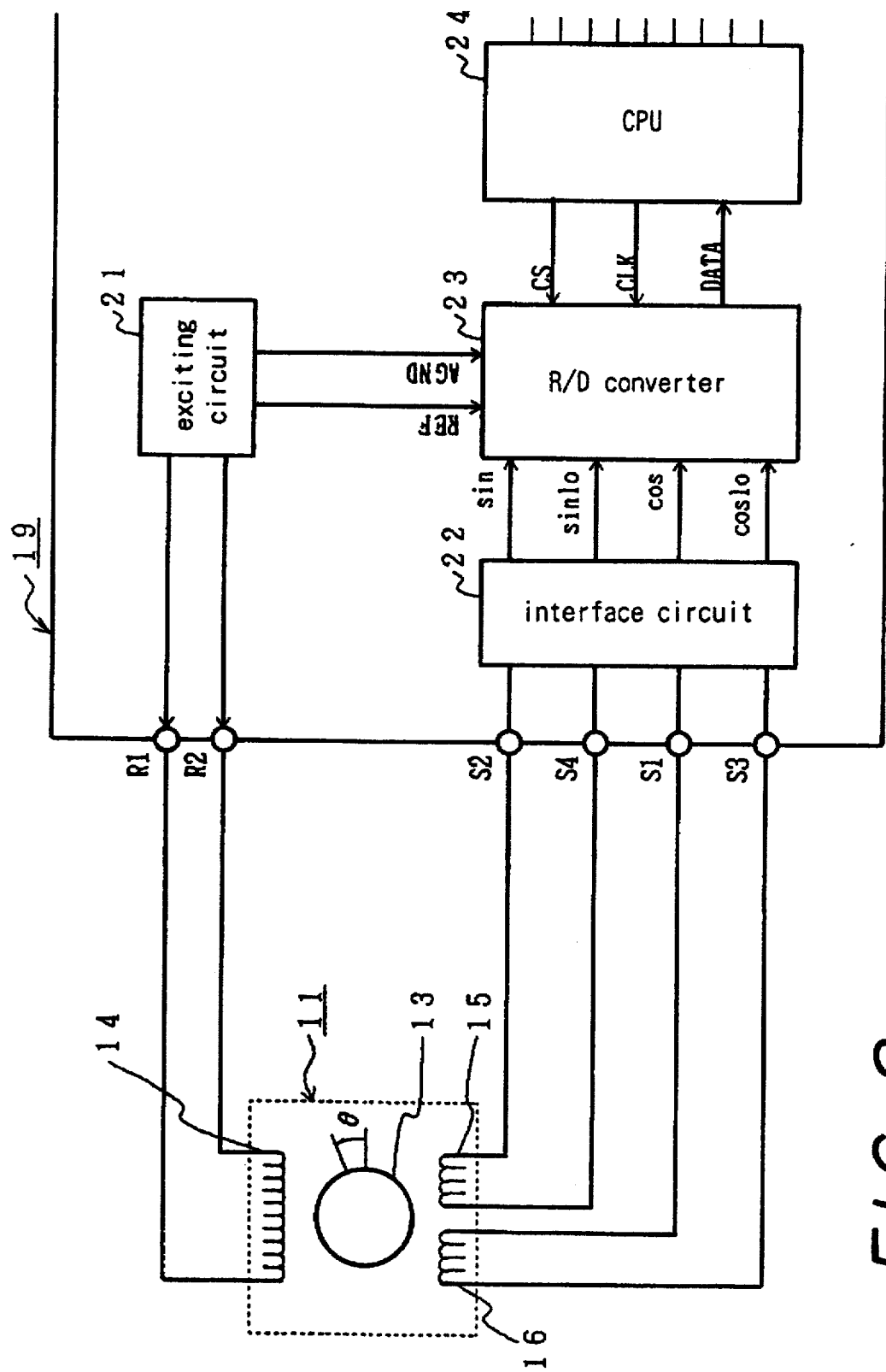
FIG. 2 is a circuit diagram of the abnormality detecting system for the rotor position detecting means in the embodiment of FIG. 1.

Referring to FIGS. 1 and 2, reference numeral 11 denotes a resolver which monitors a motor (not illustrated) and which serves as rotor position detecting means for detecting an absolute position (hereinafter referred to as "magnetic pole position") of each magnetic pole of a rotor. Reference numeral 24 denotes a CPU, reference numeral 31 denotes speed calculating means for detecting the speed of the motor, and reference numeral 32 denotes abnormality detecting means for judging whether or not an abnormality exists in the resolver 11.

In this embodiment, the resolver 11 has a 1-input, 2-output structure and is composed of a resolver rotor connected to the rotor of a motor not illustrated, primary winding 14 of a primary side, and secondary windings 15, 16 of a secondary side. The secondary windings 15 and 16 are electrically shifted 90° in phase from each other.

Reference numeral 19 denotes an electronic control device which has an exciting circuit 21, interface circuit 22, R/D (resolver digital) converter 23, and CPU 24. The primary winding 14 is connected to the exciting circuit 21 via wire harnesses R1 and R2, the secondary winding 15 is connected to the interface circuit 22 via wire harnesses S2 and S4, and the secondary winding 16 is connected to the interface circuit 22 via wire harnesses S1 and S3.

Assuming that a sinewave voltage $V_{IN}$ is $$V_{IN} = V \sin \omega t$$

which has been generated from the exciting circuit 21 is applied to the primary winding 14, induced voltages $V_{OUT1}$ and $V_{OUT2}$ which are $$V_{OUT1} = K \cdot V \sin \omega t \cdot \sin \theta$$

$$V_{OUT2} = K \cdot V \sin \omega t \cdot \cos \theta$$

and are output values of the resolver 11 are output from the secondary windings 15 and 16 and these outputs are input to the R/D converter 23 via the interface circuit 22.

The R/D converter 23 can obtain a magnetic pole position signal DATA which represents the magnetic pole position from the amplitude ratio between the induced voltages $V_{OUT1}$ and $V_{OUT2}$, and this magnetic pole position signal DATA is output to the CPU 24.

The CPU 24 produces a current waveform of the phase current in corresponding relation to the load conditions of an electric vehicle such as, for example, the amount of depression of the accelerator. And the CPU 24 outputs to an inverter (INV)(not illustrated) a UVW-phase pulse width modulating signal having a pulse width corresponding to a torque instruction value.

Meanwhile, the resolver 11 is intended to be used for detecting the magnetic pole position of the motor and this resolver 11 is indispensable to the motor. Accordingly, when the wire harnesses S1 to S4 and R1 and R2 of the resolver 11 are broken, when shortcircuiting occurs in the wire harnesses S1 to S4 and R1 and R2, or when the exciting circuit 21 fails, it becomes difficult to control the motor, so that the driver has a feeling of discomfort or a secondary failure occurs in the motor system.

In order to prevent the occurrence of these problems, abnormality detecting means 32 (FIG. 1) is disposed in the CPU 24.

The abnormality detecting means 32 calculates an instantaneous speed of the motor and an average speed within a prescribed time period of the motor at all times. When the wire harnesses S1 to S4, R1, and R2 Of the resolver 11 are broken, when shortcircuiting occurs in the wire harnesses S1 to S4, R1, and R2, or when the exciting circuit 21 fails, the relationship between instantaneous speed and the average speed of the motor within a prescribed time period varies. Accordingly, the breakage of the wire harnesses S1 to S4, R1 and R2, shortcircuiting thereof, or failure of the exciting circuit 21 can be easily detected at low cost.

In this case, since it is not necessary to dispose a secondary rotation sensor, resolver abnormality detector, etc., it is possible not only to reduce the cost but also to decrease the probability of a system shut down due to a failsafe procedure.

Figure 3:
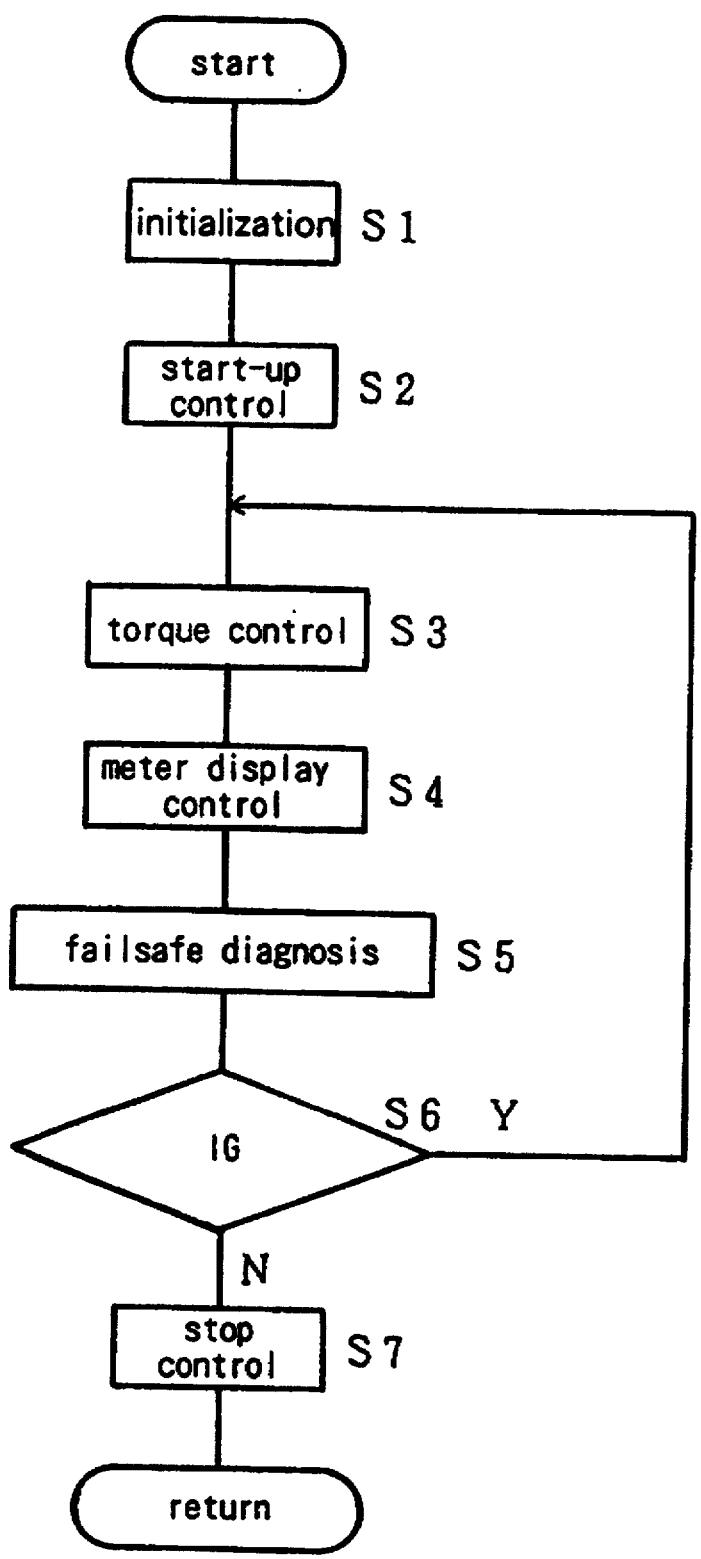
FIG. 3 is a flowchart of a main routine for operation of the motor control system of the present invention.

FIG. 3 is a flowchart of a main routine performed in the motor control system of the embodiment of the present invention. Note that the main routine is a program which concerns the general flow on the electric vehicle.

Step S1—Initialization the CPU 24 (FIG. 2) (I/O device reset, timer reset, RAM clear, etc.) is performed.

Step S2—It is examined whether or not there is an abnormality in each of the respective associated systems such as a sensor system, battery voltage system, etc. If there is no abnormality in each system, a main battery and the inverter are connected to each other to thereby perform start-up control.

Step S3—Torque control is performed. In this case, the signals which represent the amount of depression of the accelerator, vehicle speed, etc. are read to thereby calculate a torque instruction value, which is output to a motor controller (not illustrated).

Step S4—Meter display control is performed. In this case, vehicle speed, failure data, etc. are displayed on an instrument panel (not illustrated) on the driver's side.

Step S5—Failsafe diagnosis is performed. In this case, it is detected whether or not an abnormality has occurred in the above-mentioned system and, if an abnormality has occurred, failsafe processing is performed using a stored diagnosis code.

Step S6—It is judged whether or not an ignition (IG) switch SW is "ON". If the ignition switch has been kept "ON", the operation returns to step S3 while, on the other hand, if the ignition switch is "OFF", the operation proceeds to step S7.

Step S7—Stop control is performed. In this case, the main battery and the inverter are disconnected from each other and the power source of the CPU 24 is turned off.

Next, the operation of the abnormality detecting means 32 is explained.

Figure 4:
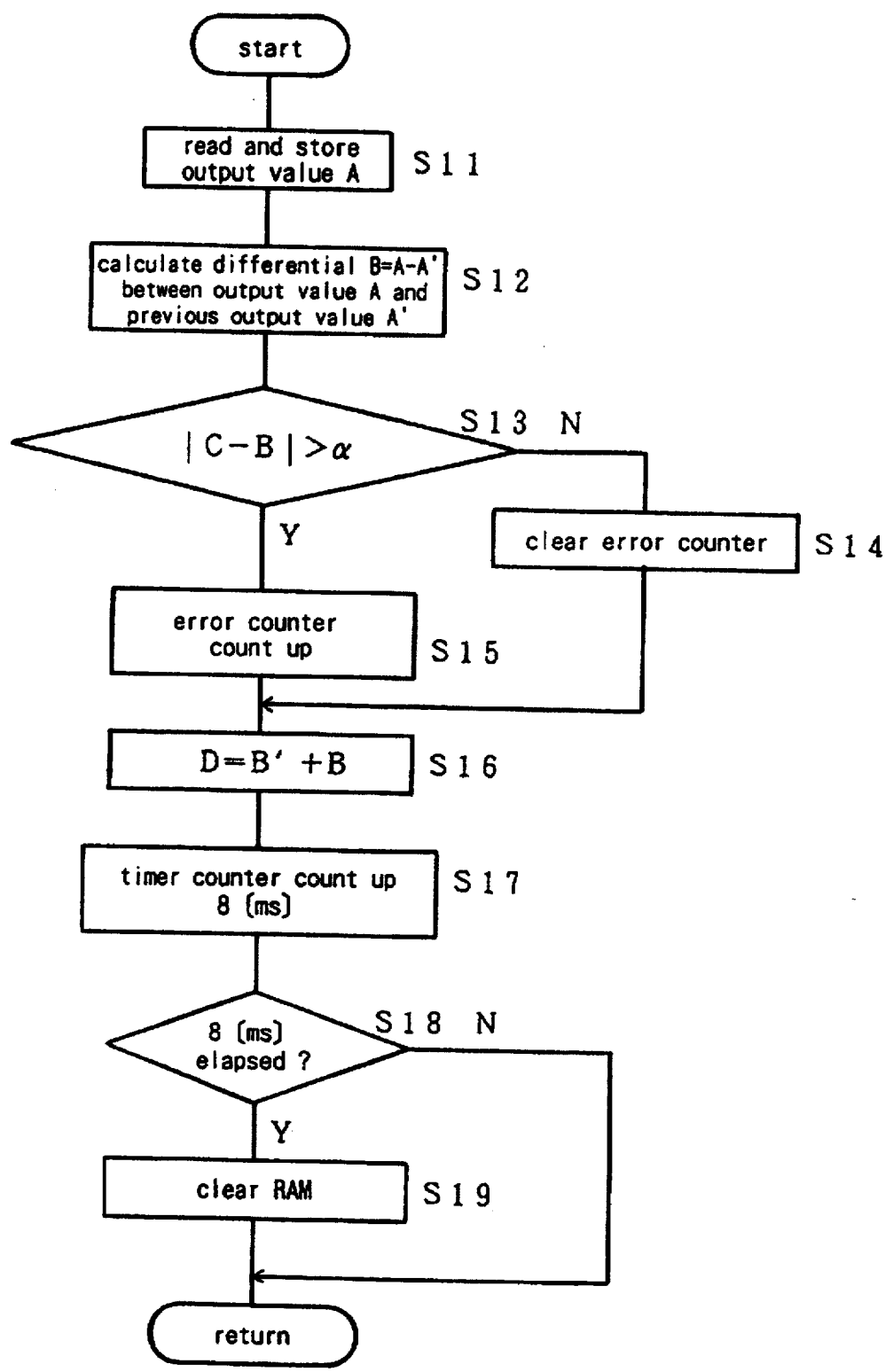
FIG. 4 is a flowchart of a 100 μs interruption routine executed by the abnormality detecting system for the rotor position detecting means in the embodiment of FIG. 1.

FIG. 4 is a flowchart of a 100 μs interruption routine performed by the abnormality detecting system for the rotor position detecting means of the embodiment of the present invention.

Step S11—The output value A of the R/D converter 23 (FIG. 2) is read and this output value A is temporarily stored in a RAM (not illustrated). This output value A represents a magnetic pole position (absolute angle).

Step S12—From the present output value A and a previous output value A' (which represents an output value preceding the present output value A by a very short time period t (100 microseconds)) the instantaneous speed B which represents the angular velocity of the rotor which has been rotated during the very short time period t is calculated as follows:

$$B = A - A'$$

Step S13—A difference (C−B) between the instantaneous speed B and an average speed, which is calculated through the execution of an 8 ms interruption routine as later described, is calculated. Then, the absolute value |C−B| of the difference (C−B) and a set value α are compared with each other and it is judged whether or not the absolute value |C−B| is larger than the set value α. If the absolute value |C−B| is larger than the set value α, the operation proceeds to step S15 while, on the other hand, if the absolute value |C−B| is not larger than the set value α, the operation proceeds to step 14. Note that the set value α is set to be a value greater than an acceleration which cannot exist in view of the power performance of the electric vehicle.

Step S14—It is judged that the resolver 11 is normal and the error counter (not illustrated) which is set in the RAM is cleared.

Step S15—The counted value K of the error counter is counted up. This counting-up operation is performed for the purpose of preventing the abnormality detecting means 32 (FIG. 1) from making an erroneous judgement due to noise or the like. Namely, it is intended not to judge through only one conditional determination that the resolver 11 is abnormal, but to judge for the first time that the resolver 11 is abnormal when the counted value K is, for example, 10.

Step S16—An integrated value D is calculated by adding the present instantaneous speed B to an integrated value B' of the instantaneous speed values up to the previous instantaneous speed value, and this integrated value D is stored in the RAM. Namely, in order to calculate the average speed C, the instantaneous speeds B obtained by samplings performed in 100 μs units are integrated in a value corresponding to an 8 ms time period. Accordingly, the integrated value D of 80 of the instantaneous speeds B is calculated.

Step S17—An 8 ms timer counter (not illustrated) is counted up.

Step S18—It is judged whether or not a time period of 8 ms has passed (whether or not the counted value of the 8 ms timer counter has become 80). If a time period of 8 ms has passed, the operation proceeds to step 19 while, on the other hand, if a time period of 8 ms has not yet passed, the operation returns.

Step S19—The RAM for the integrated value D and the RAM for the counted value of the 8 ms timer counter are each cleared, whereupon the operation returns.

Figure 5:
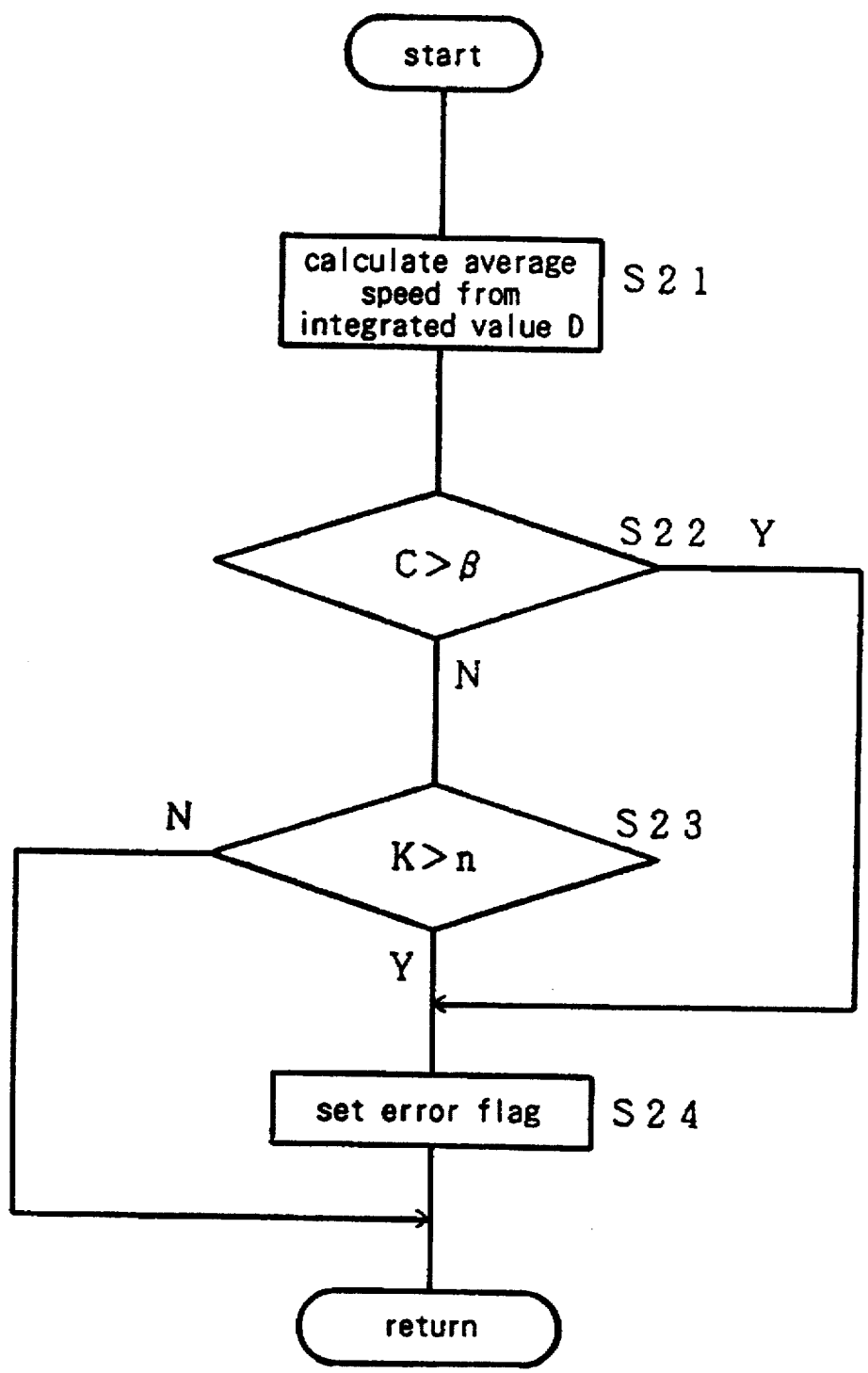
FIG. 5 is a flowchart of an 8 ms interruption routine executed by the abnormality detecting system for the rotor position detecting means in the embodiment of FIG. 1.

FIG. 5 is a flowchart of an 8 ms interruption routine performed by the abnormality detecting system for the rotor position detecting means of the embodiment of the present invention.

Step S21—The integrated value D is divided by 80 to calculate the average speed (number of rotations) C.

Step S22—Comparing the average speed C and a speed (number of rotations) β which is a set value greater than the maximum vehicle speed reachable in terms of the power performance of the electric vehicle, it is judged whether or not the average speed C is greater than the speed β. If the average speed C is greater than the speed β, the operation proceeds to step S24 while, on the other hand, if the average speed C is not greater than the speed β, the operation proceeds to step S23.

Step S23—It is judged whether or not the counted value K of the error counter (not illustrated) is greater than a set value n (for example, 10). If the counted value K is greater than the set value n, the operation proceeds to step S24 while, on the other hand, if the counted value K is not greater than the set value n, the operation returns. Step S24—An error flag is set.

Note the following. In step S5 in FIG. 3, it is examined whether or not the error flag is set. If the error flag is set, the diagnosis code is stored and the electric vehicle is stopped with safety and a warning is given to the driver.

Next, the operations of the abnormality detecting means 32 at normal and abnormal states of the resolver 11 (FIG. 1) will be explained.

Figure 6:
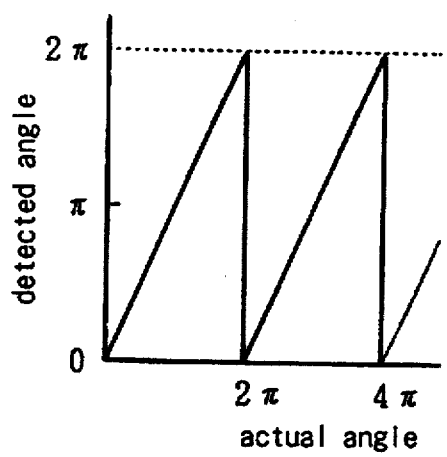
FIG. 6 illustrates a waveform of a detection angle signal from an R/D converter when the resolver in the embodiment of FIG. 1 is operating normally.
Figure 7:
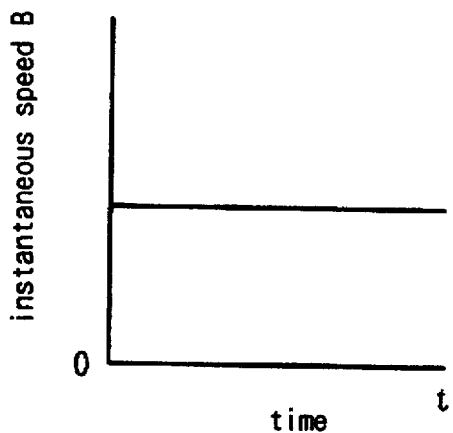
FIG. 7 illustrates a waveform of an instantaneous speed signal when the resolver in the embodiment of FIG. 1 is operating normally.
Figure 8:
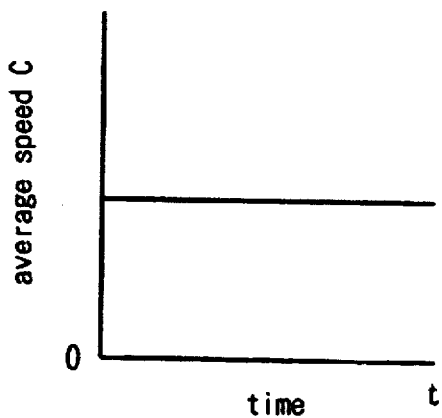
FIG. 8 illustrates a waveform of an average speed signal when the resolver in the embodiment of FIG. 1 is abnormal.

FIG. 6 illustrates a waveform of the detection angle signal from the R/D converter at a time when the resolver in the embodiment of the present invention is normal, FIG. 7 illustrates a waveform of the instantaneous speed signal at a time when the resolver in the embodiment of the present invention is normal, and FIG. 8 illustrates a waveform of the average speed signal at a time when the resolver in the embodiment of the present invention is normal. Note that in FIG. 6 the actual angle is plotted on the abscissa and the detection angle on the ordinate, in FIG. 7 the time t is plotted on the abscissa and the instantaneous speed B on the ordinate, and in FIG. 8 the time t is plotted on the abscissa and the average speed C on the ordinate.

As illustrated, when the resolver 11 (FIG. 2) is normal, the detection angle signal from the R/D converter is proportional to the variation in the actual angle of the resolver rotor 13. In this case, each of the instantaneous speed B and the average speed C becomes fixed.

Figure 9:
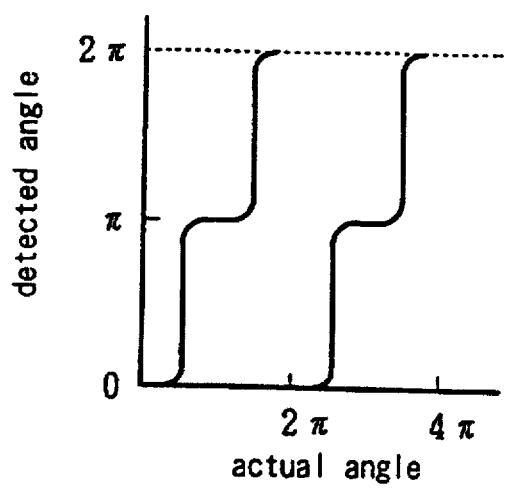
FIG. 9 illustrates a first waveform of the detection angle signal from the R/D converter when the resolver in the embodiment of FIG. 1 is abnormal.
Figure 10:
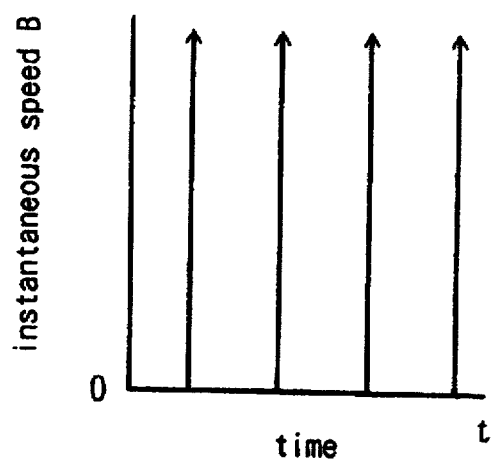
FIG. 10 illustrates a first waveform of the instantaneous speed signal when the resolver in the embodiment of FIG. 1 is abnormal.
Figure 11:
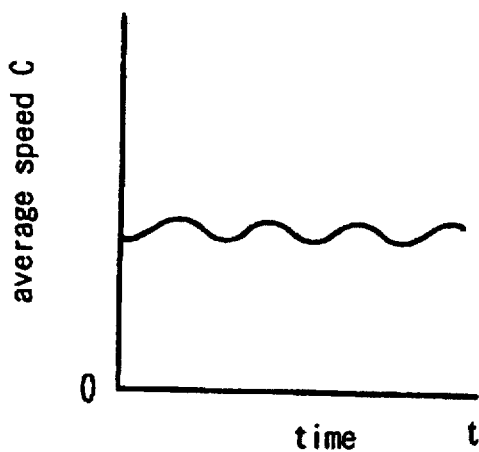
FIG. 11 illustrates a first waveform of the average speed signal when the resolver in the embodiment of FIG. 1 is abnormal.

FIG. 9 illustrates a first waveform of the detection angle signal from the R/D converter at a time when the resolver in the embodiment of the present invention is abnormal, FIG. 10 illustrates a first waveform of the instantaneous speed signal at a time when the resolver in the embodiment of the present invention is abnormal, and FIG. 11 illustrates a first waveform of the average speed at a time when the resolver in the embodiment of the present invention is abnormal. Note that in FIG. 9 the actual angle is plotted on the abscissa and the detection angle on the ordinate, in FIG. 10 the time t is plotted on the abscissa and the instantaneous speed B on the ordinate, and in FIG. 11 the time t is plotted on the abscissa and the average speed C on the ordinate.

As illustrated, when breakage of the wire harnesses S2, 84 (FIG. 2), shortcircuiting of the wire harnesses occurs, or the like, the detection angle signal from the R/D converter 23 is not proportional to the variation in the actual angle of the resolver 13, but varies stepwise. In this case, the instantaneous speed B repeatedly exhibits a great value of zero, which cannot exist in view of the power performance, in units of a prescribed time period, and the average speed C exhibits fluctuations.

Figure 12:
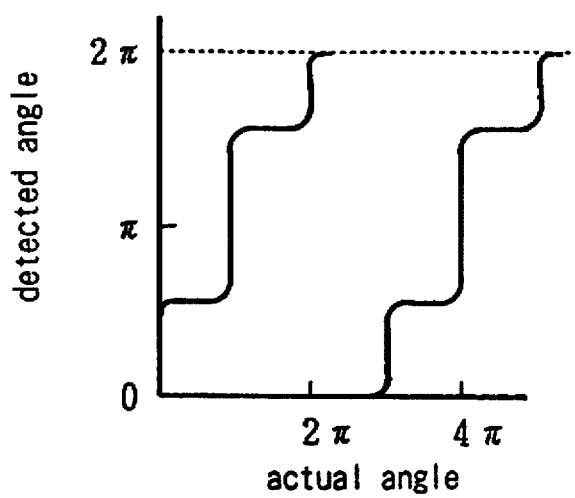
FIG. 12 illustrates a second waveform of the detection angle signal from the R/D converter when the resolver in the embodiment of FIG. 1 is abnormal.
Figure 13:
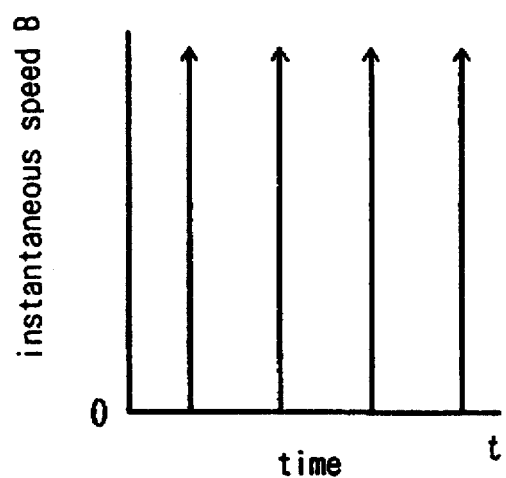
FIG. 13 illustrates a second waveform of the instantaneous speed signal when the resolver in the embodiment of FIG. 1 is abnormal.
Figure 14:
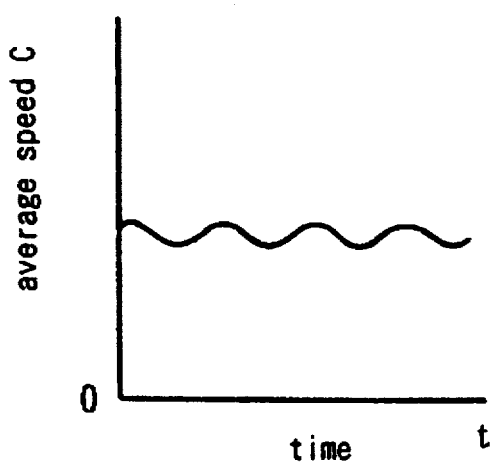
FIG. 14 illustrates a second waveform of the average speed signal when the resolver in the embodiment of FIG. 1 is abnormal.

FIG. 12 illustrates a second waveform of the detection angle signal from the R/D converter at a time when the resolver in the embodiment of the present invention is abnormal, FIG. 13 illustrates a second waveform of the instantaneous speed signal at a time when the resolver in the embodiment of the present invention is abnormal, and FIG. 14 illustrates a second waveform of the average speed signal at the time when the resolver in the embodiment of the present invention is abnormal. Note that in FIG. 12 the actual angle is plotted on the abscissa and the detection angle on the ordinate, in FIG. 13 the time t is plotted on the abscissa and the instantaneous speed B on the ordinate, and in FIG. 14 the time t is plotted on the abscissa and the average speed C on the ordinate.

As illustrated, when breakage of the wire harnesses S1, S3 (FIG. 2), shortcircuiting of these wire harnesses, or the like occurs, the detection angle of the R/D converter 23 is not proportional to the variation in the actual angle of the resolver 13, but varies stepwise. In this case, instantaneous speed B repeatedly exhibits a high value of zero in units of a prescribed time period, and which cannot exist in view of the power performance, and the average speed C exhibits fluctuations.

Figure 15:
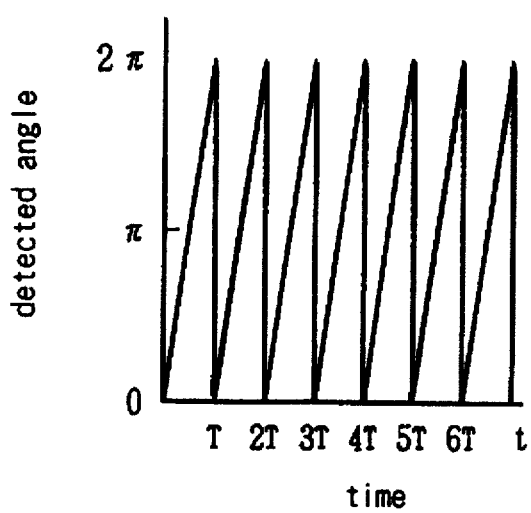
FIG. 15 illustrates a third waveform of the detection angle signal from the R/D converter when the resolver in the embodiment of FIG. 1 is abnormal.
Figure 16:
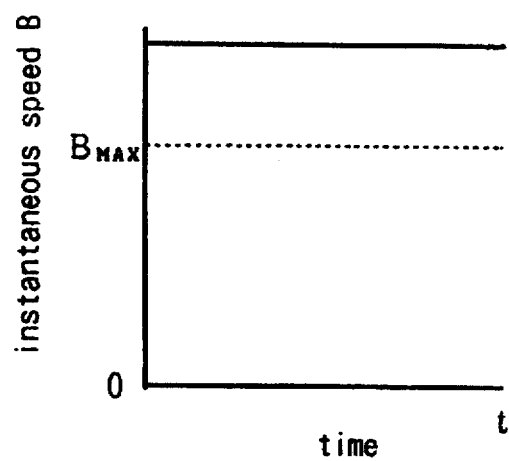
FIG. 16 illustrates a third waveform of the instantaneous speed signal when the resolver in the embodiment of FIG. 1 is abnormal.
Figure 17:
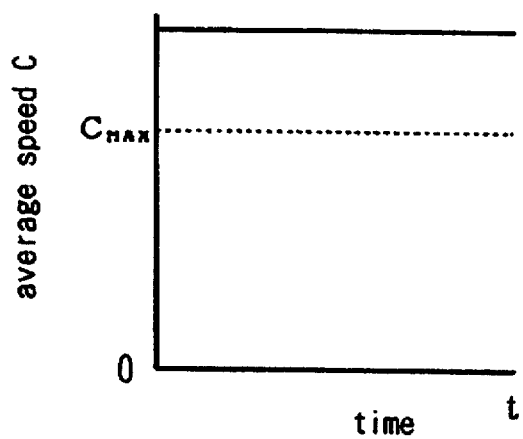
FIG. 17 illustrates a third waveform of the average speed signal when the resolver in the embodiment of FIG. 1 is abnormal.

FIG. 15 illustrates a third waveform of the detection angle signal from the R/D converter at a time when the resolver in the embodiment of the present invention is abnormal, FIG. 16 illustrates a third waveform of the instantaneous speed signal at a time when the resolver in the embodiment of the present invention is abnormal, and FIG. 17 illustrates a third waveform of the average speed signal at a time when the resolver in the embodiment of the present invention is abnormal. Note that in FIG. 15 the time t is plotted on the abscissa and the detection angle on the ordinate, in FIG. 16, the time t is plotted on the abscissa and the instantaneous speed B on the ordinate, and in FIG. 17 the time t is plotted on the abscissa and the average speed C on the ordinate.

As illustrated, when breakage of the wire harnesses R1, R2 (FIG. 2), shortcircuiting of these wire harnesses, or like occurs, the detection angle of the R/D converter 23 is proportional to the variation in the actual angle of the resolver 13. For example, in a case where the detection angle is sampled in 100 μs units, it becomes zero at each time point of T, 2T, 3T, 4T, 5T, and 6T (T-1600 μs). At this time, the instantaneous speed B always exceeds a maximum value $B_{MAX}$ while, on the other hand, the average speed C always exceeds a maximum value $C_{MAX}$.

Next, the motor control system having the above-constructed abnormality detecting system for the rotor position detecting means will be explained.

Figure 18:
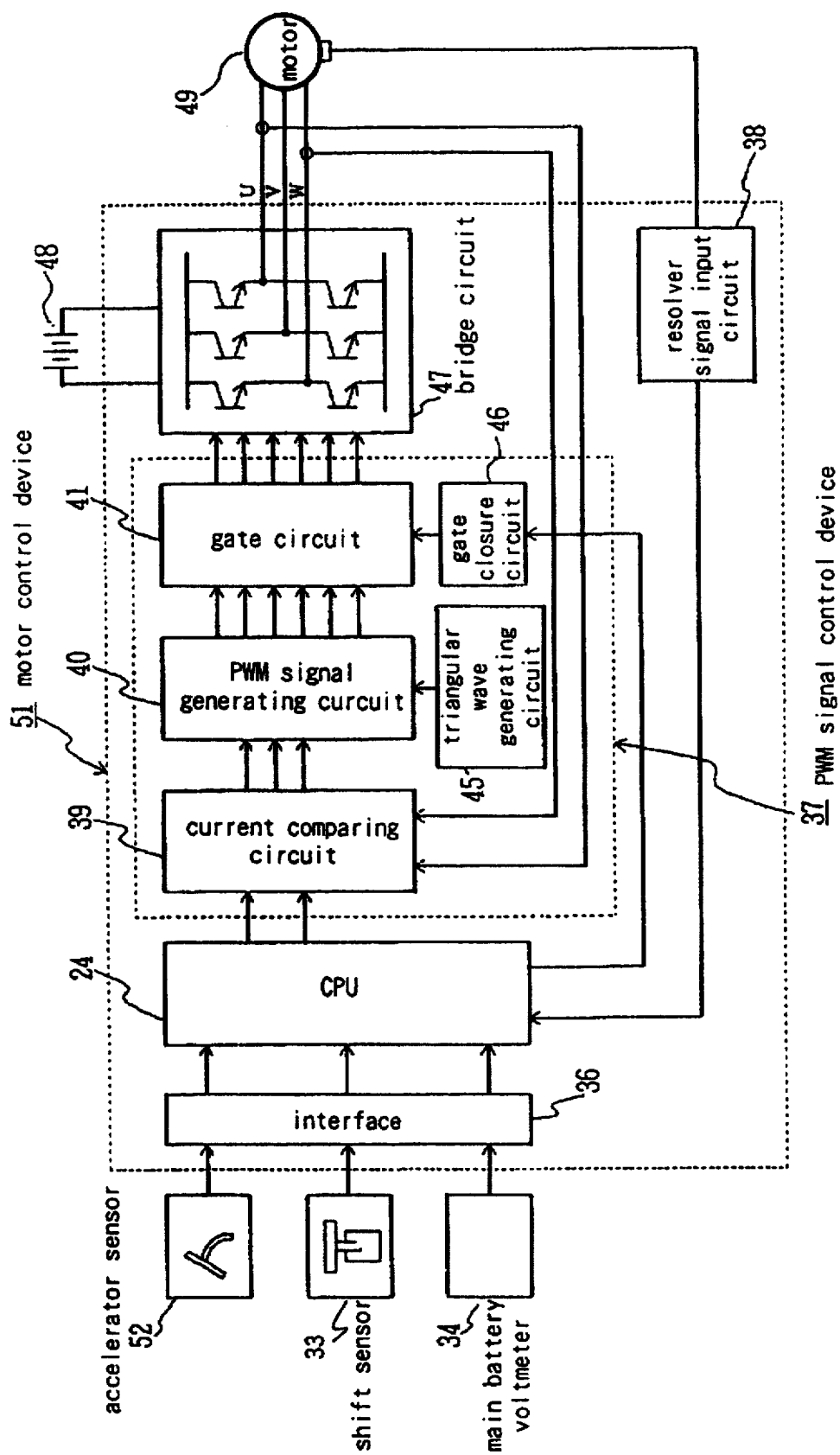
FIG. 18 is a block diagram of the entire motor control system in accordance with an embodiment of the present invention.

FIG. 18 is a block diagram illustrating the motor control system of the embodiment of the present invention.

Referring to FIG. 18, reference numeral 51 denotes the motor control system, reference numeral 52 denotes an accelerator sensor which serves as torque instruction value detecting means, reference numeral 33 denotes a shift sensor for detecting a selected range, and reference numeral 34 denotes a main battery voltmeter for detecting a main battery 48. Input sensor signals such as an accelerator depression amount signal from the accelerator sensor 52, a detection signal from the shift sensor 33, a voltage signal from the main battery voltmeter 34, etc. are input to the CPU 24 via an interface circuit 36.

The CPU 24 outputs a current instruction signal (amplitude and phase) to a current comparing circuit 39 on the basis of the above-mentioned input sensor signals and a resolver signal from a resolver signal input circuit 38. Note that the resolver signal input circuit 38 is composed of the interface circuit 22 of FIG. 2 and the R/D converter 23.

In the current comparing circuit 39, the current instruction signal and motor current signals fed back from a motor 49 are compared with each other and a deviation signal therebetween is output to a PWM signal generating circuit 40. The PWM signal generating circuit 40 compares the input deviation signal and an input standard triangular wave signal from a triangular wave signal generating circuit 45 to generate a switching pulse signal which is output from the circuit 40 to a gate circuit 41 as a PWM signal.

The gate circuit 41 divides the input PWM signal into upper and lower stages of a bridge circuit 47 as an inverter and, on the other hand, forms dead times and outputs these signals to the bridge circuit 47. The bridge circuit 47 performs switching of a direct current from the main battery 48 to generate a 3-phase (U-phase, V-phase, and W-phase) alternating current.

In the above-constructed motor control system 51, when a gate closure circuit 46 operates according to an instruction from the abnormality detecting means 32 and a gate closure instruction signal from the gate closure circuit 46 is input to the gate circuit 41, the above-mentioned switching pulse signal is interrupted, whereby each switching element of the bridge circuit 47 becomes completely inoperative.

Additionally, the current comparing circuit 39, PWM signal generating circuit 40, gate circuit 41, triangular wave generating circuit 45, and gate closure circuit 46 compose a PWM signal control device 37.

Additionally, the present invention is not limited to the above-mentioned embodiment but can be variously modified without departing from the subject matter of the present invention, such modifications not detracting from the scope of the invention.

What is claimed is:

1. An apparatus for rotor position sensing with abnormality detection, comprising:

rotor position detecting means for detecting a magnetic pole position of a motor, speed calculating means for calculating instantaneous speed and average speed of the motor on the basis of an output value generated by the rotor position detecting means, and abnormality detecting means for comparing an absolute value of a difference between the instantaneous speed and average speed of the motor with a set value and for determining an abnormality in the rotor position detecting means as an absolute value of the difference greater than the set value.

2. A method for detecting an abnormality in rotor position detecting means, comprising:

calculating an instantaneous speed and an average speed of a motor on the basis of an output value from the rotor position detecting means;

calculating an absolute value of a difference between the instantaneous speed and the average speed;

comparing the calculated absolute value with a set value; and responsive to a determination that the absolute value of the difference is greater than the set value, signaling an abnormality in the rotor position detecting means.

3. A method for detecting an abnormality in rotor position detecting means, comprising;

calculating an average speed of a motor on the basis of an output value from the rotor position detecting means;

comparing the calculated average speed with a set value; and responsive to a determination that the average speed is greater than the set value, signaling an abnormality in the rotor position detecting means.

4. A motor control system comprising:

rotor position detecting means for detecting a magnetic pole position of a motor and for generating pole position signals representative of the detected magnetic pole position, torque instruction value detecting means for detecting a torque command to the motor and for generating a torque command signal, a PWM signal control device for outputting a PWM signal based on the pole position and torque command signals, an inverter for converting direct current from a battery to alternating current and for outputting an alternating current corresponding to the PWM signal from the PWM signal control device to the motor, speed calculating means for calculating instantaneous speed and average speed of the motor based on the pole position signals, abnormality detecting means for comparing an absolute value of a difference between the instantaneous speed and average speed of the motor with a set value and for determining an abnormality in the rotor position detecting means as an absolute value of the difference greater than the set value, and interruption means for, responsive to a determination of an abnormality by the abnormality detecting means interrupting a PWM signal from the PWM signal control device.

5. A motor control system according to claim 4, wherein the PWM signal control device comprises a triangular wave generating circuit for generating a standard triangular wave signal, a current comparing circuit for comparing the pole position and torque command signals with feedback motor current signals and for outputting current deviation signals representative of the comparison, a PWM signal generating circuit for outputting PWM signals in response to the current deviation signals from the current comparing circuit and the standard triangular wave signal from the triangular wave generating circuit, a gate circuit for amplifying the PWM signals from the PWM signal generating circuit and for outputting the amplified signals to the inverter, and a gate closure circuit for, responsive to a determination by the abnormality detecting means that the rotor position detecting means is abnormal, interrupting the PWM signals from the PWM signal generating circuit.

6. An apparatus for rotor position sensing with abnormality detection, comprising:

rotor position detecting means for detecting a magnetic pole position of a motor;

speed calculating means for calculating average speed of the motor on the basis of an output value generated by the rotor position detecting means; and abnormality detecting means for comparing the calculated average speed with a set value and for determining an abnormality in the rotor position detecting means as a calculated average speed greater than the set value.

7. A motor control system comprising:

rotor position detecting means for detecting a magnetic pole position of a motor and for generating pole position signals representative of the detected magnetic pole position;

torque instruction value detecting means for detecting a torque command to the motor and for generating a torque command signal;

a PWM signal control device for outputting a PWM signal based on the pole position and torque command signals;

an inverter for converting direct current from a battery to alternating current and for outputting an alternating current corresponding to the PWM signal from the PWM signal control device to the motor;

speed calculating means for calculating average speed of the motor based on the pole position signals;

abnormality detecting means for comparing the calculated average speed with a set value and for determining an abnormality in the rotor position detecting means as a calculated average speed greater than the set value; and interruption means for, responsive to a determination of an abnormality by the abnormality detecting means, interrupting a PWM signal from the PWM control device.

8. A motor control system according to claim 7, wherein the PWM signal control device comprises a triangular wave generating circuit for generating a standard triangular wave signal, a current comparing circuit for comparing the pole position and torque command signals with feedback motor current signals and for outputting current deviation signals representative of the comparison, a PWM signal generating circuit for outputting PWM signals in response to the current deviation signals from the current comparing circuit and the standard triangular wave signal from the triangular wave generating circuit, a gate circuit for amplifying the PWM signals from the PWM signal generating circuit and for outputting the amplified signals to the inverter, and a gate closure circuit for, responsive to a determination by the abnormality detecting means that the rotor position detecting means is abnormal, interrupting the PWM signals from the PWM signal generating circuit.

* * * * *

UNITED STATES PATENT AND TRADEMARK OFFICE
CERTIFICATE OF CORRECTION

PATENT NO. : 5,691,611
DATED : November 25, 1997
INVENTOR(S) : KOJIMA et al

It is certified that error appears in the above-identified patent and that said Letters Patent is hereby corrected as shown below:

Col. 5, line 18, "84" should read --S4--; and
      line 28, "Of" should read --of--.
Col. 7, line 66, "84" should read --S4--.
Col. 10, line 36, after "means" insert a comma --,--.

Signed and Sealed this

Twenty-fourth Day of November,1998

Attest:

BRUCE LEHMAN

*Attesting Officer*    *Commissioner of Patents and Trademarks*